US008418098B2

(12) United States Patent
Huang et al.

(10) Patent No.: US 8,418,098 B2
(45) Date of Patent: Apr. 9, 2013

(54) ADVISORY SYSTEM FOR VERIFYING SENSITIVE CIRCUITS IN CHIP-DESIGN

(75) Inventors: Chi-Heng Huang, Hsin-Chu (TW); Gary Lin, Zhunan Town (TW); Chu-Fu Chen, Zhubei (TW); Yi-Kan Cheng, Taipei (TW); Fu-Lung Hsueh, Kaohsiung (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 717 days.

(21) Appl. No.: 12/054,195

(22) Filed: Mar. 24, 2008

(65) Prior Publication Data
US 2009/0172617 A1 Jul. 2, 2009

Related U.S. Application Data

(60) Provisional application No. 61/017,519, filed on Dec. 28, 2007.

(51) Int. Cl.
*G06F 17/50* (2006.01)
*H03K 5/22* (2006.01)

(52) U.S. Cl.
USPC ........... 716/106; 716/100; 716/101; 716/104; 716/108; 716/109; 716/111; 703/14; 327/66; 327/97

(58) Field of Classification Search .................. 716/1, 2, 716/4, 5, 9, 10, 12; 703/14; 327/66, 97
See application file for complete search history.

(56) References Cited

U.S. PATENT DOCUMENTS

| | | | | | |
|---|---|---|---|---|---|
| 5,369,614 | A | * | 11/1994 | Miyanishi | 365/207 |
| 5,606,518 | A | * | 2/1997 | Fang et al. | 703/13 |
| 5,991,522 | A | * | 11/1999 | Shoen | 716/103 |
| 5,999,021 | A | * | 12/1999 | Jang | 327/97 |
| 6,263,479 | B1 | * | 7/2001 | Tajima | 716/124 |
| 6,285,975 | B1 | * | 9/2001 | Nair et al. | 703/14 |
| 6,643,834 | B2 | * | 11/2003 | Satoh et al. | 716/139 |
| 6,873,282 | B1 | * | 3/2005 | Murphy | 341/164 |
| 7,251,795 | B2 | * | 7/2007 | Biswas et al. | 716/103 |
| 7,418,683 | B1 | * | 8/2008 | Sonnard et al. | 716/5 |
| 7,458,041 | B2 | * | 11/2008 | Hershenson et al. | 716/2 |
| 7,478,354 | B2 | * | 1/2009 | McGrath et al. | 716/12 |
| 7,516,426 | B2 | * | 4/2009 | Hook et al. | 716/133 |
| 7,609,496 | B2 | * | 10/2009 | Motonobu et al. | 361/93.1 |
| 7,667,477 | B2 | * | 2/2010 | Nagata | 324/763 |
| 8,201,137 | B1 | * | 6/2012 | Bhushan et al. | 716/139 |
| 2002/0095648 | A1 | * | 7/2002 | Saito | 716/10 |
| 2007/0006110 | A1 | * | 1/2007 | Naka et al. | 716/12 |
| 2009/0007032 | A1 | * | 1/2009 | Kariat et al. | 716/4 |
| 2010/0095262 | A1 | * | 4/2010 | Garg et al. | 716/9 |

* cited by examiner

*Primary Examiner* — Helen Rossoshek
(74) *Attorney, Agent, or Firm* — Slater & Matsil, L.L.P.

(57) ABSTRACT

A verification system for verifying an integrated circuit design is provided. The verification system includes a functional block finding module configured to identify potential sensitive circuits in the integrated circuit design; and a search module. The search module is configured to find sensitive circuits from the potential sensitive circuits; and verify the sensitive circuits.

22 Claims, 2 Drawing Sheets

ADVISORY SYSTEM FOR VERIFYING SENSITIVE CIRCUITS IN CHIP-DESIGN

This application claims the benefit of the following provisionally filed U.S. Patent Application: Ser. No. 61/017,519, filed Dec. 28, 2007, entitled "Advisory System for Verifying Sensitive Circuits in Chip-Design," which application is hereby incorporated herein by reference.

TECHNICAL FIELD

This invention relates generally to the design of integrated circuits, and more particularly to the verification of chip-design, and even more particularly to the verification of sensitive circuits in semiconductor chips.

BACKGROUND

As technology nodes continue to shrink, circuit operations become increasingly more sensitive to process and environmental conditions. As a result, semiconductor chips become increasingly more susceptible to design-related yield loss, which is often caused by the flawed design of sensitive circuits, such as analog circuits. The verification of the chip-design thus becomes more important.

FIG. 1 illustrates a conventional flow for verifying chip-designs. Typically, the chip-designs are provided using files with a commonly-known graphic data system (GDS) format (block 2). Design rule check (DRC) and electrical rule check (ERC) are performed at full-chip level for capturing basic design errors (block 4). Next, the GDS files are converted to netlists (block 6) that can be used by simulation tools, such as special programs for interactive circuit elements (SPICE). SPICE simulations are then performed on the netlists to check for the performance of the circuits (block 8).

The conventional chip-verification schemes suffer from drawbacks. The DRC and ERC checks can only be used for checking basic operation correctness. They are not suitable for verifying sensitive analog circuits. Since SPICE simulations need exhaustive simulations, input patterns, and design disciplines for schematics and layouts, to accurately determine the extent of problems in a typical analog circuit, literally millions of SPICE iterations may need to be performed, which requires a great amount of input vectors and corner conditions. Conventionally, the SPICE simulations were only performed on the circuit blocks in the chip instead of the entire chip, often because full-chip SPICE simulations are too complicated and too time consuming. Although simplified assumptions can be made to reduce the number of SPICE iterations, the simplification may result in significant flaws in analog circuit not being captured.

It is to be realized that the chip-verifications are performed in non-ideal environments. Various situations may occur during the chip-verifications, including: designers failing to follow common design practices or best known methods (BKMs); IP-level checking being performed without taking neighboring circuits into consideration; schematic and layout designs being performed by different groups of people because of the needed specific expertise; the SPICE simulations being performed improperly; and key parameters being omitted in extractions/simulations. These situations may result in the further degradation in the quality of the chip-verifications. New methods and systems for performing chip-verifications with improved efficiency and improved quality are thus needed.

SUMMARY OF THE INVENTION

In accordance with one aspect of the present invention, a verification system for verifying an integrated circuit design is provided. The verification system includes a functional block finding module configured to identify potential sensitive circuits in the integrated circuit design; and a search module. The search module is configured to find sensitive circuits from the potential sensitive circuits; and verify the sensitive circuits In accordance with another aspect of the present invention, a verification system for verifying an integrated circuit design includes an analog finding module configured to identify potential analog circuits in the integrated circuit design; a database storing signature connection rules of key analog circuits; an analyze module configured to find power nodes and ground nodes of the potential analog circuits; and a search module. The search module is configured to find analog circuits from the potential analog circuits by comparing the potential analog circuits with the signature connection rules of the key analog circuits, wherein the power nodes and the ground nodes are used in the step of finding the analog circuits. The search module is further configured to verify the analog circuits.

In accordance with yet another aspect of the present invention, a computer program for checking a layout of an integrated circuit includes functional block finding codes for identifying potential sensitive circuits in the layout; and searching codes. The searching codes are for finding sensitive circuits from the potential sensitive circuits; and verifying the sensitive circuits.

In accordance with yet another aspect of the present invention, a method for verifying an integrated circuit design includes identifying potential sensitive circuits in the integrated circuit design; finding sensitive circuits from the potential sensitive circuits; and verifying the sensitive circuits.

In accordance with yet another aspect of the present invention, a method for verifying an integrated circuit design includes identifying potential analog circuits in the integrated circuit design; finding power nodes and ground nodes of the potential analog circuits; finding analog circuits from the potential analog circuits by comparing the potential analog circuits with signature connection rules of key analog circuits, wherein the power nodes and the ground nodes are used in the step of finding the analog circuits; and verifying the analog circuits.

The advantageous features of the embodiments of the present invention include the ability to automatically identify and selectively verifying sensitive circuits, and improved efficiency in the verification processes.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

When a semiconductor chip is taped out, the first-time-silicon success is important for designers and manufacturers due to the difficulty in pinpointing problems. Chip-verification thus needs to be performed extensively before tape-out occurs. Particularly, for semiconductor chips including sensitive circuits such as analog circuits, which are more sensitive to process variations and inferior design practices, the chip-verification processes become even more important.

Figure 1:
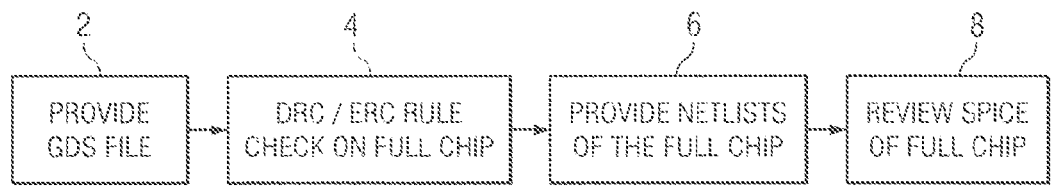
FIG. 1 illustrates a conventional flow of a chip-verification process.
Figure 2:
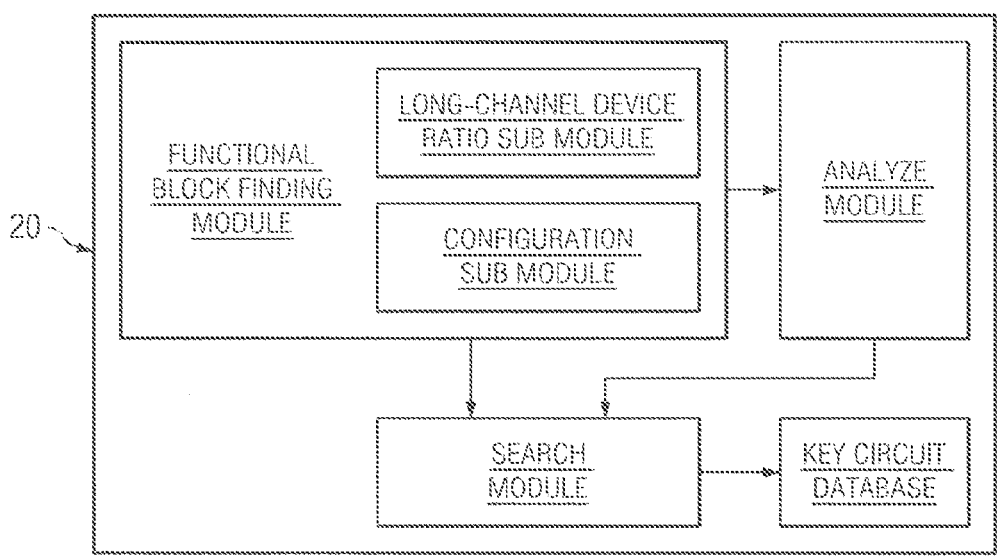
FIG. 2 illustrates a block diagram of an advisory system for performing the chip verification process.

FIG. 2 illustrates a block diagram of an embodiment of the present invention, which shows (verification) advisory system 20 for performing chip-verifications, and functional modules in advisory system 20. The functions of advisory system 20 are briefly discussed to provide an overview of the embodiments of the present invention, while the detailed discussions of the functions are provided in subsequent paragraphs.

Advisory system 20 includes a functional block finding module, an analyze module, and a search module. Throughout the description, analog circuits are used as exemplary sensitive circuits to explain the concept of the present invention. Accordingly, the functional block finding module is alternatively referred to as an analog finding module. In the preferred embodiment, the analog finding module, the analyze module, and the search module each includes computer codes for performing verifications on chip-designs, and hardware for inputting the chip-designs, and outputting the verification results.

When a chip-design is provided to advisory system 20, the analog finding module may traverse all the circuit blocks/cells in the chip-designs, and identify potential analog circuits. Depending on the criteria used by the analog finding module, the potential analog circuits identified by the analog finding module may include some non-analog circuits (digital circuits). The identified potential analog circuits are then passed to the search module, which may compare the identified potential analog circuits with key analog circuits, which are pre-stored in a key circuit database. If a circuit in the potential analog circuits matches the connection rules of any of the key analog circuits, the circuit is confirmed to be a true analog circuit. Verification will thus be performed on the analog circuit. Otherwise, the circuit is not an analog circuit, and no verification (or at least no analog-specific verifications) will be performed on it.

When the search module tries to match the potential analog circuits with the connection rules of key analog circuits, the search module needs to know the power nodes (VDD) and the ground nodes (VSS) of the potential analog circuits. The task of identifying the power nodes and the ground nodes of the potential analog circuits is performed by the analyze module.

Figure 3:
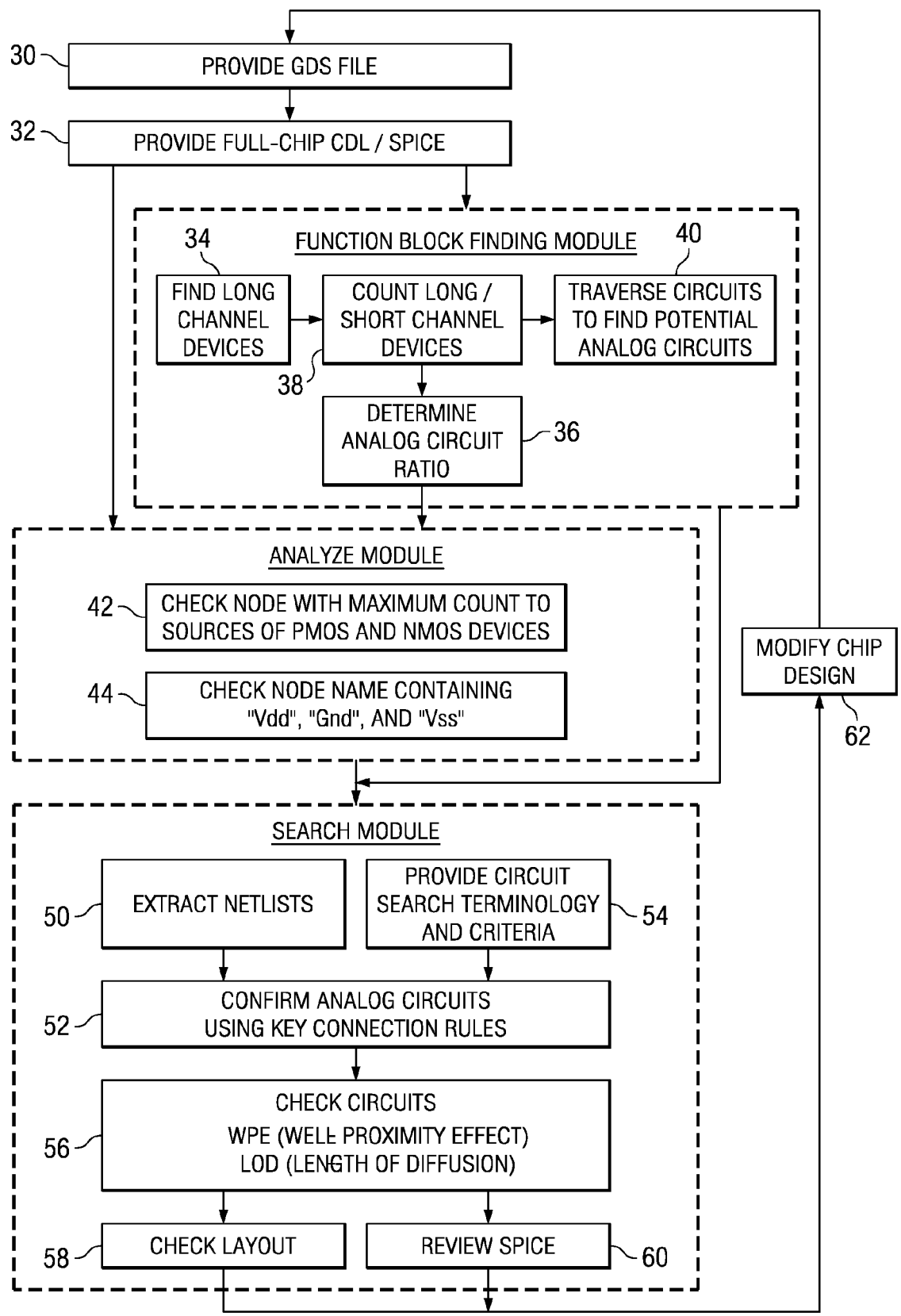
FIG. 3 illustrates functional blocks of the advisory system.

FIG. 3 illustrates functions performed by the functional modules in an exemplary advisory system 20. To start a chip-verification process, a layout of chip-design is first provided (step 30). The chip layout may be in the form of graphic data system (GDS) format, or any other applicable formats. The chip layout is converted to netlists (step 32), which may have a format used by commonly used component description language (CDL), or by special programs for interactive circuit elements (SPICE).

Next, the netlists are provided to the analog finding module (functional block finding module) to identify potential analog circuits. It is realized that digital devices, such as metal-oxide-semiconductor (MOS) devices, are typically formed using a minimum rule or a near-minimum rule, and hence the channel lengths of digital devices are often close to the minimum length (often referred to as critical dimension) allowed by the formation technology. Conversely, analog devices, such as bipolar-junction transistors (BJT), often have channel lengths noticeably greater than the minimum length. If a relative channel length of a circuit, which is a ratio of the channel length of the device to the minimum length, is equal to or greater than a pre-determined reference channel length ratio (having a value greater than 1), the device may be considered as a long channel device (block 34). Otherwise, it will be considered as a short channel device. By counting the total number of long channel devices and the total number of devices in a circuit (which may be performed by a long-channel device ratio sub module in FIG. 2, also refer to step 38), a long-channel device ratio may be calculated (step 36). In an analog circuit, it is expected that long channel devices will have a substantial number. In the embodiments of the present invention, if the long-channel device ratio is greater than (or no less than) a pre-determined reference analog device ratio, the circuit is a potential analog circuit. Otherwise, it is a digital circuit.

It is appreciated that the determination of the values of the reference channel length ratio and the reference analog device ratio are objective, and different values may be selected. In the analog finding module, the reference channel length ratio and the reference analog device ratio are configurable. The configuration and the user interfaces may be performed by a configuration sub module (refer to FIG. 2). It is realized that if the reference channel length ratio and the reference analog device ratio are too high, there is the risk that an analog circuit(s) may be wrongfully considered as a digital circuit(s), and is excluded out of the subsequent verification processes. It is thus preferred to have these values configured relatively small, even if this may cause some of the digital circuits being put into the potential analog circuit list. However, excessively small values of the reference channel length ratio and the reference analog device ratio result in too many digital circuits being put into the potential analogy circuit list. As a result, the chip-verification process may be unnecessarily prolonged. Optimum values of the relative channel length and the reference analog device ratio may be found through experiments, and may be configured and adjusted through the configuration sub module in FIG. 2. The reference channel length ratio may be greater than about 1.5. In an exemplary embodiment, the reference channel length ratio is about 2. The reference analog device ratio may be greater than about 20%.

The netlists have a hierarchical structure, with the chip-design as an entirety being at the top level of the hierarchy, and smaller circuits (or blocks/cells, referred to as circuit blocks hereinafter) at lower levels. Preferably, the analog finding module starts from the top level, that is, the chip level, and traverses down to lower-level circuit blocks (step 40 in FIG. 3). For each of the circuit blocks, the analog finding module determines the relative channel length of each of the devices, and calculates an analog device ratio for the circuit block. If the calculated analog device ratio is lower than the reference analog device ratio, the current circuit block is a non-analog circuit block, and the analog finding module continues to traverse down to its sub blocks (at a lower hierarchical level). If, however, the analog device ratio is greater than or equal to the reference analog device ratio, the current circuit block is a potential analog circuit. The analog finding module then puts the current circuit block into the potential analog circuit list, and stops traversing the sub levels of the current circuit block.

After all potential analog circuits in the chip have been identified, the analog finding module passes the list of the potential analog circuits to the analyze module, which examines each of the potential analog circuits and identifies power nodes and ground nodes. Throughout the description, a ground node is also referred as a VSS node.

In an embodiment, for each of the potential analog circuits, the analyze module looks for the node that is connected to the maximum number of sources of PMOS devices, and identifies the node as the power node (block 42). Accordingly, the analyze module goes through all nodes that are connected to the sources of PMOS devices, and compares the numbers of the PMOS devices connected to the nodes. Similarly, the analyze module looks for the node that is connected to the maximum number of sources of NMOS devices, and identifies the node as the ground node (also refers to block 42). Accordingly, the analyze module goes through all nodes that are connected to the sources of NMOS devices, and compares the numbers of the NMOS devices connected to the nodes.

The power nodes and the ground nodes may be found by checking the nodes' names, and identifying the node names including strings commonly used to mark the power nodes and the ground nodes, including "VDD," "Vdd," "GND," "Gnd," "VSS," "Vss," and the like (block 44). In the preferred embodiment, both methods are combined to ensure the power nodes and the ground nodes are found.

The analog finding module also passes the list of potential analog circuits to the search module, which identifies/confirms analog circuits from the potential analog circuits, and performs verification on the analog circuits. First, the search module extracts a netlist for each of the potential analog circuits (block 50). Please note that the analog finding module may have already extracted the netlists of the potential analog circuits. However, the search module may need more information, such as length of OD region (LOD), well proximity effect (WPE), poly space effect, and the like, than the analog finding module, and hence a second extraction may be needed.

As shown as block 52, the netlists of the potential analog circuits are compared to key analog circuits pre-stored in the key (analog) circuit database (refer to FIG. 2, also see block 54). The key analog circuit database includes a plurality of terminologies, and a plurality of sets of signature connection rules indexed by the terminologies. The signature connection rules specify how the circuits may be connected, and is used to uniquely identify the terminologies associated with the connection rules. For example, the key analog circuit database may include the terminology of "current mirror" and the connection rules of all known current mirrors. Accordingly, if a circuit is found to satisfy the connection rules of the current mirrors, this circuit must be a current mirror. The key analog circuit database preferably includes the terminology and connection rules of all known analog circuits, including current mirrors, RC filters, differential pairs, cross-couple devices, auto-zero amplifiers, bias circuits, dividers, voltage-controlled oscillators, current steering digital-analog converters (DAC), level-shifters, band-gap circuits, charge pumps, and the like.

The key analog circuit database may also include components such as device varactors, resistors, capacitors (for example, metal-oxide-metal (MOM) capacitor), and BJT transistors. These components may also be verified later against possible problems such as leakage, non-symmetry, and the like. Also, the components may be identified to make sure that right types of the components are used in the chip-design. If more key analog circuits and more connection rules are found, the key circuit database can be expanded to include the newly founded key analog circuits and the corresponding connection rules.

If any circuit in the potential analog circuits is found to include one or more of the key analog circuits, the circuit is confirmed as being an analog circuit. Otherwise, the circuit is a non-analog circuit and will not be verified by advisory system 20.

Next, the analog circuits are verified, for example, for well proximity effect (WPE), length of diffusion, poly space effect, or any other physical or electrical parameters/variations that may affect the functionality and performance of the analog circuits (block 56). If the verification of an analog circuit yields no problem, no further verification is performed on the analog circuit. If, however, the verification of the analog circuit results in a problem or a potential problem, the analog circuit needs to be further verified by layout checking (block 58) and SPICE simulation (block 60). The layout checking may be performed using a customized utility, and the layout of the analog circuit is examined thoroughly. In the SPICE simulation, a SPICE file is generated for the analog circuit, and the electrical performance of the analog circuit is simulated to identify any design flaw.

Advisory system 20 may then generate a summary report, reporting problematic analog circuits, issuing warnings against certain circuits of potential problems, and providing suggestions as how to fix the problems. The chip-design may thus be modified according to the findings in the chip-verification (block 62). After the modification, the above-discussed chip-verification and modification are preferably repeated until no new problems are found.

Figure 4:
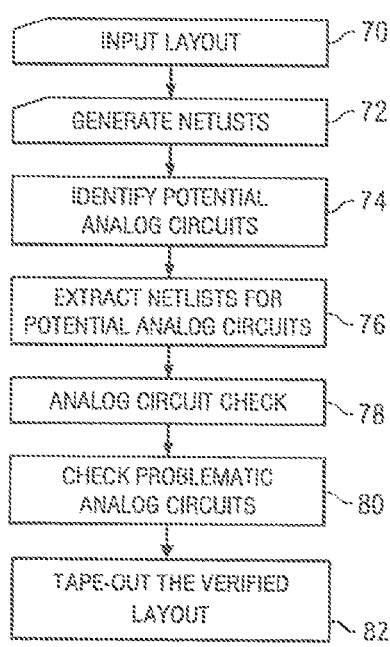
FIG. 4 illustrates a flow of an exemplary chip-verification process.

The steps discussed in the preceding paragraphs may be briefly illustrated in the flow chart shown in FIG. 4. When a layout is input into advisory system 20 (step 70), netlists are generated (step 72), for example, by a full-chip generator, which may be a layout verses schematic (LVS) system. The potential analog circuits are then identified (step 74), and the netlists of the potential analog circuits are further extracted (step 76). Next, the potential analog circuits are checked (step 78), which checking step includes identifying true analog circuits, and verifying the analog circuits to find problematic analog circuits. The problematic analog circuits will then go through more extensive check steps (step 80), including the layout check and the SPICE simulation. After the problematic analog circuits have been checked and the layout has been verified, the layout may be taped out (step 82) to facilitate formation of the semiconductor chip.

Although throughout the description, analog circuits are used as examples to explain the concept of the present invention, the embodiments of the present invention are readily applicable to other sensitive circuits sensitive to process variations, for example, sensitive digital circuits such as comparators, latches, and the like. Accordingly, the key circuit database (refer to FIG. 2) may be expanded to include signature connection rules of these sensitive circuits.

The embodiments of the present invention have several advantageous features. First, the sensitive circuits in semiconductor chips may be selectively verified. The verification only needs the design layout as the input, and no complicated SPICE simulation stimuli is required. Since the verification schemes of the present invention can be run much faster than SPICE simulations, full-chip-verifications become possible.

Although the present invention and its advantages have been described in detail, it should be understood that various changes, substitutions and alterations can be made herein without departing from the spirit and scope of the invention as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A verification system for verifying an integrated circuit design, the verification system comprising:
   a functional block finding module configured to identify potential sensitive circuits in the integrated circuit design, wherein the step of identifying comprises:
   traversing a hierarchy of the integrated circuit design;
   selecting a first and a second block in the hierarchy of the integrated circuit design;
   determining a first long-channel device ratio of the first block and a second long-channel device ratio of the second block, wherein the first long-channel device ratio is greater than a pre-determined reference analog device ratio, and wherein the second long-channel device ratio is no greater than the pre-determined reference analog device ratio;
   placing the first block into the potential sensitive circuits; and
   leaving the second block out of the potential sensitive circuits;
   a search module configured to:
   find sensitive circuits from the potential sensitive circuits; and
   verify the sensitive circuits; and
   an analyze module configured to:
   find power nodes and ground nodes of the potential sensitive circuits; and
   provide the power nodes and the ground nodes to the search module; and wherein the functional block finding module, the search module, and the analyze module are implemented by a computer.

2. The verification system of claim 1, wherein the analyze module finds the power nodes and the ground nodes by looking for a first node connected to a maximum number of sources of PMOS devices, and finds the ground nodes by looking for a second node connected to a maximum number of sources of NMOS devices, and wherein the first and the second nodes are one of the power nodes and one of the ground nodes, respectively.

3. The verification system of claim 1 further comprising a database storing signature connection rules of key sensitive circuits, wherein the search module is configured to find the sensitive circuits by comparing the potential sensitive circuits with the signature connection rules of the key sensitive circuits.

4. The verification system of claim 3, wherein the database comprises terminologies and the signature connection rules of devices selected from the group consisting essentially of device varactors, resistors, metal-oxide-metal capacitors, bipolar-junction transistors, and combinations thereof.

5. The verification system of claim 1, wherein the function of verifying the sensitive circuits comprises verifying a parameter selected from the group consisting essentially of well proximity effect, length of diffusion, poly space effect, and gate area for leakage.

6. The verification system of claim 1 further comprising a utility for converting the integrated circuit design from a graphic data system (GDS) format to netlists, wherein the functional block finding module identifies the potential sensitive circuits from the netlists.

7. A verification system for verifying an integrated circuit design, the verification system comprising:
   an analog finding module configured to identify potential analog circuits in the integrated circuit design;
   an analyze module configured to find power nodes and ground nodes of the potential analog circuits;
   a search module configured to:
   find analog circuits from the potential analog circuits by comparing the potential analog circuits with signature connection rules of key analog circuits; and
   verify the analog circuits; and wherein the analog finding module, the analyze module, and the search module are implemented by a computer.

8. The verification system of claim 7 further comprising a "netlist" full-chip generator configured to generate full-chip SPICE netlists.

9. The verification system of claim 7 further comprising a database storing the signature connection rules of the key analog circuits.

10. The verification system of claim 7, wherein the analyze module is configured to find the power nodes and the ground nodes by:
    looking for a first node connected to a maximum number of sources of PMOS devices to find the power nodes, and looking for a second node connected to a maximum number of sources of NMOS devices to find the ground nodes, wherein the first and the second nodes are one of the power nodes and one of the ground nodes, respectively; and
    looking for node names comprising a string selected from "VDD" and "Vdd" to find the power nodes, and looking for node names comprising a string selected from "VSS," "Vss," "GND," and "Gnd" to find the ground nodes.

11. The verification system of claim 8, wherein the function of verifying the analog circuits comprises verifying a parameter selected from the group consisting essentially of well proximity effect, length of diffusion, poly space effect, and gate area for leakage.

12. A method for checking a layout of an integrated circuit, the method comprising:
    determining long-channel device ratios of circuit blocks in the integrated circuit;
    comparing the long-channel devices ratios with a pre-determined reference analog device ratio to find potential sensitive circuits;
    finding sensitive circuits from the potential sensitive circuits;
    verifying the sensitive circuits; and
    taping out the layout of the integrated circuit to form a semiconductor chip.

13. The method of claim 12 further comprising:
    finding power nodes and ground nodes of the potential sensitive circuits; and
    providing the power nodes and the ground nodes to the searching codes for finding the sensitive circuits.

14. A method for verifying an integrated circuit design, the method comprising:

identifying potential sensitive circuits in the integrated circuit design, wherein the potential sensitive circuits include sensitive circuits and non-sensitive circuits;

after all potential sensitive circuits are found, finding sensitive circuits from the potential sensitive circuits;

verifying the sensitive circuits; and taping out the integrated circuit to form a semiconductor chip.

15. The method of claim 14 further comprising:

finding power nodes and ground nodes of the potential sensitive circuits; and using the power nodes and the ground nodes in the step of finding the sensitive circuits.

16. The method of claim 15, wherein the step of finding the power nodes comprises looking for a first node connected to a maximum number of sources of PMOS devices, wherein the step of finding the ground nodes comprises looking for a second node connected to a maximum number of sources of NMOS devices, and wherein the first and the second nodes are one of the power nodes and one of the ground nodes, respectively.

17. The method of claim 14, wherein the step of finding the sensitive circuits further comprises comparing the potential sensitive circuits with signature connection rules of key sensitive circuits, and wherein the key sensitive circuits comprise terminologies and the signature connection rules of device varactors, resistors, metal-oxide-metal capacitors, and bipolar-junction transistors, and combinations thereof.

18. The method of claim 14 further comprising converting the integrated circuit design from a graphic data system (GDS) format to netlists before the step of identifying the potential sensitive circuits, wherein the step of identifying the potential sensitive circuits is performed on the netlists.

19. The method of claim 14, wherein non-sensitive circuits in the potential sensitive circuits are not verified.

20. A method for verifying an integrated circuit design, the method comprising:

identifying potential analog circuits in the integrated circuit design;

finding power nodes and ground nodes of the potential analog circuits;

finding analog circuits from the potential analog circuits by comparing the potential analog circuits with signature connection rules of key analog circuits;

verifying the analog circuits; and taping out the integrated circuit design to form a semiconductor chip.

21. The method of claim 20, wherein the step of verifying the analog circuit comprises verifying a parameter selected from the group consisting essentially of well proximity effect, length of diffusion, poly space effect, and gate area for leakage.

22. The method of claim 20, wherein the potential sensitive circuits further comprise non-sensitive circuits, and wherein the non-sensitive circuits are not verified before the step of taping out.

* * * * *